(12) United States Patent
Trombley et al.

(10) Patent No.: US 12,188,979 B2
(45) Date of Patent: Jan. 7, 2025

(54) ERROR PROTECTION ANALYSIS OF AN INTEGRATED CIRCUIT

(71) Applicant: INTERNATIONAL BUSINESS MACHINES CORPORATION, Armonk, NY (US)

(72) Inventors: Benjamin Neil Trombley, Hopewell Junction, NY (US); Chung-Lung K. Shum, Wappingers Falls, NY (US); Karl Evan Smock Anderson, Poughkeepsie, NY (US); Bodo Hoppe, Ingersheim (DE); Erica Stuecheli, Austin, TX (US); Shiri Moran, Kiryat Tivon (IL); Patrick James Meaney, Poughkeepsie, NY (US); Arvind Haran, Liberty Hill, TX (US); Douglas Balazich, Poughkeepsie, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 43 days.

(21) Appl. No.: 18/326,717

(22) Filed: May 31, 2023

(65) Prior Publication Data
US 2024/0402246 A1    Dec. 5, 2024

(51) Int. Cl.
*G01R 31/317* (2006.01)
*G01R 31/3181* (2006.01)
*G01R 31/3185* (2006.01)

(52) U.S. Cl.
CPC . *G01R 31/31704* (2013.01); *G01R 31/31705* (2013.01); *G01R 31/31816* (2013.01); *G01R 31/318525* (2013.01); *G01R 31/318583* (2013.01)

(58) Field of Classification Search
CPC ........ G01R 31/31704; G01R 31/31705; G01R 31/31816; G01R 31/318525; G01R 31/318583
USPC .......... 714/724, 742, 746, 758, 800; 716/52, 716/101, 102, 104, 110, 112, 136
See application file for complete search history.

(56) References Cited

U.S. PATENT DOCUMENTS

| | | | |
|---|---|---|---|
| 8,091,050 B2 * | 1/2012 | Bose | G06F 30/367 716/136 |
| 8,661,382 B2 * | 2/2014 | Lamb | G06F 30/20 716/112 |

(Continued)

FOREIGN PATENT DOCUMENTS

WO    2005041410 A1    5/2005

OTHER PUBLICATIONS

Nicolaidis, Design for Soft Error Mitigation, Sep. 2005, IEEE, vol. 5, No. 3, pp. 405-418. (Year: 2005).*

(Continued)

*Primary Examiner* — John J Tabone, Jr.
(74) *Attorney, Agent, or Firm* — Stosch Sabo

(57) ABSTRACT

Error protection analysis of an integrated circuit includes receiving a design model for the integrated circuit, and a list of error checkers associated with the design model. The design model is traversed from each of the error checkers to group storage cells of the design model into checking groups. The design model is updated to include, for each checking group, a unique group identifier associated with each of the storage cells in the checking group.

20 Claims, 4 Drawing Sheets

(56) References Cited

U.S. PATENT DOCUMENTS

| | | | |
|---|---|---|---|
| 9,021,328 B2* | 4/2015 | Huott | H03M 13/2909 714/755 |
| 9,041,428 B2* | 5/2015 | Huott | H03K 19/003 714/758 |
| 9,043,683 B2* | 5/2015 | Huott | H03M 13/29 714/755 |
| 9,316,691 B2 | 4/2016 | Chung | |
| 9,483,591 B1* | 11/2016 | Arbel | G06F 30/3323 |
| 10,365,328 B2 | 7/2019 | Sun et al. | |
| 10,438,683 B2 | 10/2019 | Sagiv et al. | |
| 11,132,483 B2 | 9/2021 | Bucci et al. | |
| 2005/0041410 A1 | 2/2005 | Yamashita et al. | |
| 2005/0144524 A1* | 6/2005 | Bonaccio | G06F 1/04 714/27 |
| 2009/0206872 A1* | 8/2009 | Shum | H03K 19/0033 326/9 |
| 2012/0072806 A1* | 3/2012 | Tabata | G06F 11/1048 714/764 |
| 2014/0201589 A1* | 7/2014 | Huott | H03M 13/2909 714/755 |
| 2015/0205906 A1* | 7/2015 | Barwin, III | G06F 30/20 716/113 |
| 2016/0378599 A1* | 12/2016 | Schmit | H03M 13/05 714/764 |
| 2018/0285190 A1* | 10/2018 | Tan | G06F 11/079 |
| 2022/0230699 A1 | 7/2022 | Patidar et al. | |

OTHER PUBLICATIONS

Hill et al., "An Accurate Flip-flop Selection Technique for Reducing Logic SER," 2008 IEEE International Conference on Dependable Systems and Networks With FTCS and DCC (DSN), Anchorage, AK, USA, Jun. 24-27, 2008, Date Added to IEEE Xplore: Sep. 23, 2008, DOI: 10.1109/DSN.2008.4630081, 9 pages.

Holcomb et al., "Design as You See Fit: System-Level Soft Error Analysis of Sequential Circuits," 2009 Design, Automation & Test in Europe Conference & Exhibition, Nice, Apr. 20-24, 2009, Date Added to IEEE Xplore: Jun. 23, 2009, DOI: 10.1109/DATE.2009.5090770, 6 pages.

Mohr et al., "A Radiation Hardened by Design Register File With Lightweight Error Detection and Correction," IEEE Transactions on Nuclear Science (vol. 54, Issue: 4, Aug. 2007), published Aug. 20, 2007, DOI: 10.1109/TNS.2007.903173, 9 pages.

Silent Data Corruption—Google Cloud Platform Console Help, retrieved on May 5, 2023, https://support.google.com/cloud/answer/10759085?hl=en, 4 pages.

* cited by examiner

ERROR PROTECTION ANALYSIS OF AN INTEGRATED CIRCUIT

BACKGROUND

Field of the Disclosure

The field of the disclosure is data processing, or, more specifically, methods, apparatus, and products for performing error protection analysis of a digital integrated circuit.

Description of Related Art

Fabrication of an integrated circuit or chip includes several steps to finalize such as logic design, analysis, and physical implementation. The chip may be designed according to a hierarchical design methodology such that the chip is divided into functional circuit components or elements. The logic design and component placement must result in a physical implementation that meets the design and performance requirements of the chip. To ensure that the design requirements are met, design analysis such as error protection analysis of the chip may be performed.

SUMMARY

Exemplary embodiments include a method, apparatus, and computer program product to perform error protection analysis of an integrated circuit. An embodiment of a method for error protection analysis of an integrated circuit includes receiving a design model for the integrated circuit, and a list of error checkers associated with the design model. The design model is traversed from each of the error checkers to group storage cells of the design model into checking groups. The design model is updated to include, for each checking group, a unique group identifier associated with each of the storage cells in the checking group.

An embodiment of an apparatus for error protection analysis of an integrated circuit includes a computer processor, and a computer memory operatively coupled to the computer processor. The computer memory having disposed within it computer program instructions that, when executed by the computer processor, cause the apparatus to: receive a design model for the integrated circuit, and a list of error checkers associated with the design model; traverse the design model from each of the error checkers to group storage cells of the design model into checking groups; and update the design model to include, for each checking group, a unique group identifier associated with each of the storage cells in the checking group.

An embodiment of a computer program product for error protection analysis of an integrated circuit includes the computer program product disposed upon a computer readable medium. The computer program product comprises computer program instructions that, when executed, cause a computer to: receive a design model for the integrated circuit, and a list of error checkers associated with the design model; traverse the design model from each of the error checkers to group storage cells of the design model into checking groups; and update the design model to include, for each checking group, a unique group identifier associated with each of the storage cells in the checking group.

The foregoing and other objects, features and advantages of the disclosure will be apparent from the following more particular descriptions of exemplary embodiments of the disclosure as illustrated in the accompanying drawings wherein like reference numbers generally represent like parts of exemplary embodiments of the disclosure.

DETAILED DESCRIPTION

Figure 1:
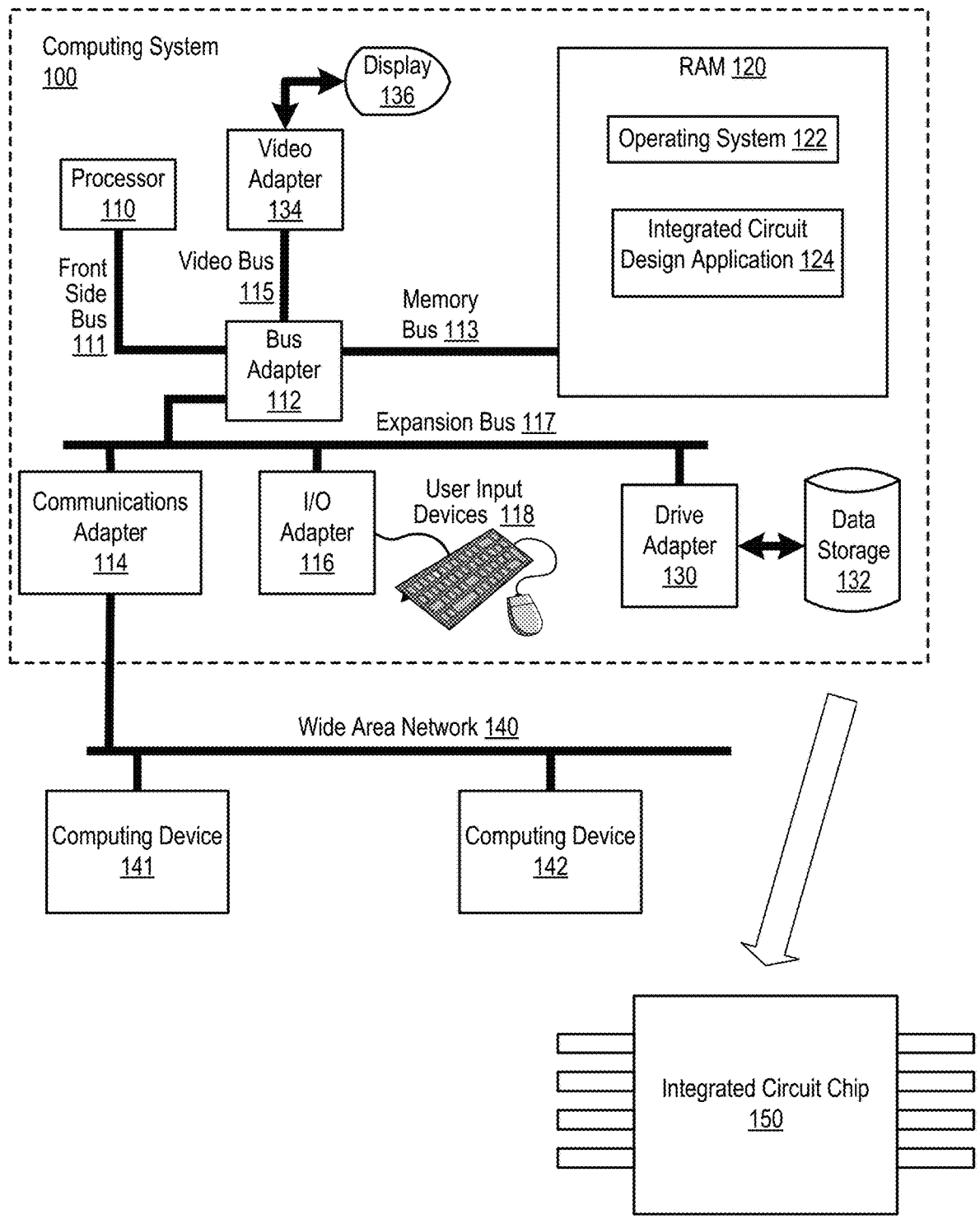
FIG. 1 shows a block diagram of an example computing system configured for performing error protection analysis of a digital integrated circuit according to some embodiments of the present disclosure.

Exemplary apparatus and systems for performing error protection analysis in accordance with the present disclosure are described with reference to the accompanying drawings, beginning with FIG. 1. FIG. 1 sets forth a block diagram of automated computing machinery comprising an exemplary computing system 100 configured for performing error protection analysis of a digital integrated circuit in accordance with embodiments of the present disclosure. The computing system 100 of FIG. 1 includes at least one computer processor 110 or 'CPU' as well as random access memory ('RAM') 120 which is connected through a high speed memory bus 113 and bus adapter 112 to processor 110 and to other components of the computing system 100.

Stored in RAM 120 is an operating system 122. Operating systems useful in computers configured for performing error protection analysis according to embodiments of the present disclosure include UNIX™, Linux™, Microsoft Windows™, AIX™, and others as will occur to those of skill in the art. The operating system 122 in the example of FIG. 1 is shown in RAM 120, but many components of such software typically are stored in non-volatile memory also, such as, for example, on data storage 132, such as a disk drive. Also stored in RAM is an integrated circuit design application 124, including for designing digital integrated circuits such as an integrated circuit 150 and performing error protection analysis of the digital integrated circuit 150 in accordance with embodiments of the present disclosure.

The computing system 100 of FIG. 1 includes disk drive adapter 130 coupled through expansion bus 117 and bus adapter 112 to processor 110 and other components of the computing system 100. Disk drive adapter 130 connects non-volatile data storage to the computing system 100 in the form of data storage 132. Disk drive adapters useful in computers configured for inserting sequence numbers into editable tables according to embodiments of the present disclosure include Integrated Drive Electronics ('IDE') adapters, Small Computer System Interface ('SCSI') adapters, and others as will occur to those of skill in the art. Non-volatile computer memory also may be implemented as an optical disk drive, electrically erasable programmable read-only memory (so-called 'EEPROM' or 'Flash' memory), RAM drives, and so on, as will occur to those of skill in the art.

The example computing system 100 of FIG. 1 includes one or more input/output ('I/O') adapters 116. I/O adapters implement user-oriented input/output through, for example, software drivers and computer hardware for controlling output to display devices such as computer display screens, as well as user input from user input devices 118 such as keyboards and mice. The example computing system 100 of FIG. 1 includes a video adapter 134, which is an example of an I/O adapter specially designed for graphic output to a display device 136 such as a display screen or computer monitor. Video adapter 134 is connected to processor 110 through a high speed video bus 115, bus adapter 112, and the front side bus 111, which is also a high speed bus.

The exemplary computing system 100 of FIG. 1 includes a communications adapter 114 for data communications with other computers and for data communications with a data communications network. Such data communications may be carried out serially through RS-232 connections, through external buses such as a Universal Serial Bus ('USB'), through data communications networks such as IP data communications networks, and in other ways as will occur to those of skill in the art. Communications adapters implement the hardware level of data communications through which one computer sends data communications to another computer, directly or through a data communications network. Examples of communications adapters useful in computers configured for inserting sequence numbers into editable tables according to embodiments of the present disclosure include modems for wired dial-up communications, Ethernet (IEEE 802.3) adapters for wired data communications, and 802.11 adapters for wireless data communications. The communications adapter 114 of FIG. 1 is communicatively coupled to a wide area network 140 that also includes other computing devices, such as computing devices 141 and 142 as shown in FIG. 1.

As integrated circuits continue to be made smaller, many new dependability issues are becoming increasingly important. For example, it has long been known that bit-flip errors in integrated circuits can be caused by alpha particles. As the size of integrated circuits become smaller, radiation-induced faults, such as single-event upsets (SEUs) and multi-bit upsets (MBUs), are becoming more common. An SEU or MBU can occur when a particle passes through an integrated circuit. Upon impacting an integrated circuit, the particle may convert its kinetic energy to electrical energy which can be deposited in the circuitry. This energy can affect the state of the circuitry, for example flipping a bit, if the deposited energy exceeds the energy level which is required to hold the correct state. An SEU occurs when a particle changes the state of a single circuit element and an MBU occurs when a particle changes the state of two or more circuit elements. Cosmic rays and other common radiation types can result in SEUs and MBUs in integrated circuits. As integrated circuits continue to decrease in size, lower energies are needed to change the internal state of the circuitry. Therefore, radiation-induced faults are becoming a reliability concern for modern integrated circuits.

With the shrinking sizes of hardware devices, design susceptibility to soft errors, such as an SEU or MBU, became a significant concern in electrical designs. Most modern designs, from application-specific integrated circuits (ASICs) to microprocessors, contain some degree of error detection and/or correction (EDC) capabilities, often implemented as supplementary logic. Storage cells (e.g., latches/registers) may be grouped into checking groups that are protected by a common error protection mechanism, such as a parity bit protection, one-hot detection, or error correction code (ECC). In general, parity protection provides single-bit error detection, but it does not handle even numbers of multi-bit errors, and provides no way to correct detected errors. Advanced error detection and correction protocols, such as single-error correction double-error detection codes, are capable of detecting both single-bit and multi-bit errors and correcting single-bit errors. These protocols use a special algorithm to encode information in a block of bits that contains sufficient detail to permit the recovery of one or more bit errors in the data. Unlike parity protection, which uses a single bit to provide protection to some number of bits, ECC circuits may use larger groupings such as 7 bits to protect 32 bits, or 8 bits to protect 64 bits. In general, the strength of an error control mechanism is represented by the Hamming distance of the error control mechanism, which indicates the minimum number of binary digits that differ between any two code words in the code.

MBUs have been known for some time in areas like static random access memories (SRAMs), where storage device density is high. Structured, human engineered logic and placement is done in these custom specialized areas to arrange storage cell placement to avoid more than one bit flip within a checking group. In general, the probability of experiencing an upset in two storage cells can be determined by the relative placement of the two storage cells. For example, the probability of experiencing an upset in two storage cells decreases as the distance between the two storage cells is increased. Accordingly, by controlling the relative placement of the storage cells of a word, the number of MBUs that are experienced by the word can be decreased. In addition, by controlling the placement of the storage cells of a word to minimize the chance of an MBU in the word, a weaker error control mechanism can be used to protect the word, thereby reducing the overhead associated with the error control mechanism.

In some cases, a design may adhere to strict reliability requirements and may be designed with an extensive amount of error detection and correction in it such that almost all functional storage cells may be protected against soft (or hard) errors using hardware error checkers. Different methodologies and techniques are used to verify that a given design meets its reliability requirements. One of these methods is code review, which occurs during the logic implementation phase. A goal of the review process is to make sure that storage cells in the design are protected according to a corresponding specification. For example, if a specification indicates that a command bus is to be protected by parity checking, the design reviewer will have to make sure that is what was actually implemented in the hardware description (for example, the Very High Speed Integrated Circuit Hardware Design Language (VHDL)). Since the verification process involves going thru many lines of code across various files, the process can be time-consuming, expensive, and error prone.

Examples of the present disclosure are directed to an automated method of grouping storage cells into checking groups in an integrated circuit design. In some examples, this is done using structural analysis of an integrated circuit design, with considerations given to pipeline stages, as well as textual analysis with name-based intuition built into the automation. Some examples assign attributes and directives for use by other design tools or human engineers, such as for placement, clock synthesis, or signoff checking. Some examples traverse an integrated circuit design model from each error checker to group storage cells of the design model into checking groups, and then update the design model to include, for each checking group, a unique group identifier associated with each of the storage cells in the checking group. In some examples, the design model may be in a textual source code form, such as VHDL code, or in binary form, such as in a netlist.

The generation of an integrated circuit involves a number of phases including the logic design, physical synthesis, routing, and manufacturing phases. Each of the phases can include multiple processes that can be performed iteratively. The logic design can provide a register transfer level (RTL) description. The physical synthesis phase includes identifying and placing components, such as gate logic, to implement the logic design. After optimizing timing and clocks, a netlist can be produced to indicate the interconnections among components. A netlist may include logical hierarchical groupings of circuit components and electrical connections (e.g., one or more first-level design blocks, one or more second-level design blocks, etc.). A given one of the hierarchical groupings may have one or more electrical connections to one or more other hierarchical groupings. Checking logic information may be extracted from the netlist. When there is a parity calculation associated with a checker, the netlist may be traversed to identify storage cells that may be protected by the parity check. In the routing phase, the placement of wires that connect gates and other components in the netlist is defined, and in the manufacturing phase, the finalized design is provided for physical implementation of the chip.

Figure 2:
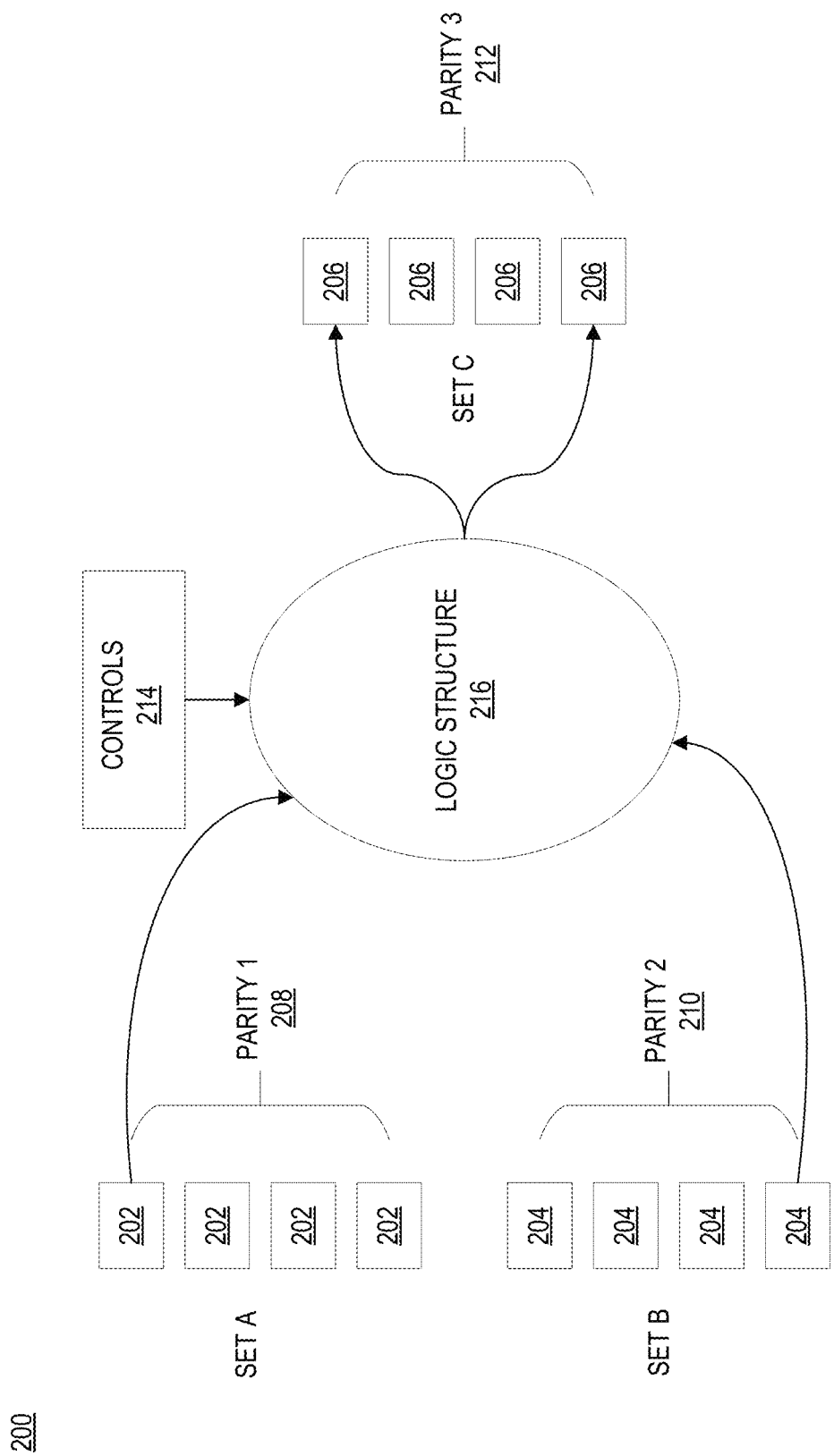
FIG. 2 shows an example of grouping storage cells into checking groups in an error protection analysis according to some embodiments of the present disclosure.

FIG. 2 shows an example of grouping 200 storage cells into checking groups in an error protection analysis according to some embodiments of the present disclosure. As shown in FIG. 2, a set A of four storage cells 202 are checked by a parity 1 checker 208 and are grouped into a parity 1 group. A set B of four storage cells 204 are checked by a parity 2 checker 210 and are grouped into a parity 2 group. A set C of four storage cells 206 are checked by a parity 3 checker 212 and are grouped into a parity 3 group. In some examples, logic structure 216 is a multiplexer that is controlled by controls 214. In an example, during any given cycle, logic structure 216 may either transfer the data from storage cells 202 to storage cells 206 or transfer the data from storage cells 204 to storage cells 206. Thus, storage cells 202 are checked at a first level by parity 1 checker 208 and are checked at a second level by parity 3 checker 212. Storage cells 204 are checked at a first level by parity 2 checker 210 and are checked at a second level by parity 3 checker 212.

Some examples disclosed herein are directed to an automated method for detecting parity or one-hot checking groups, assigning a unique identifier to each checking group, and for each checking group, associating the unique identifier for that group with each storage cell in the checking group. For example, the storage cells of a first checking group in a design may all be colored a first color, and the storage cells of a second checking group in the design may all be colored a second color different than the first color, etc. As another example, the storage cells of a first checking group in a design may each be associated with a first unique name (e.g., the name of a first parity checker), and the storage cells of a second checking group in the design may each be associated with a second unique name (e.g., the name of a second parity checker), etc. Each storage cell may be labeled in the design to identify the checking group to which the storage cell belongs. Other tools (e.g., clock synthesis, placement, checking, etc.) may then use this information to, for example, perform automatic spacing when storage cells are placed physically, and/or perform automatic checking to see if storage cells are spaced by the desired physical distance. In some examples, the storage cells are spaced by the desired physical distance within each checking group.

Various examples of assigning storage cells to checking groups are described in further detail below using different colors to represent different checking groups. Some example methods perform the groupings while ignoring controls (e.g., controls 214) and honoring data checking structures. Some example methods assign colors separately by level. Some example methods assign colors separately within a level. Some example methods provide an improved run-time using parallel checker partitions. Some example methods identify and remove unnecessary error checkers, which reduces area and power. Some example methods ignore (e.g., do not color) storage cells checked by ECC since it is able to detect 2-bit errors.

The different colors used in example methods described below are represented with prime indicators, such that a set A of storage cells having a first color is represented by A'. These storage cells having a second color is represented by A". These storage cells having a third color is represented by A'". Thus, a single prime indicates a first color, a double prime indicates a second color, and a triple prime indicates a third color, wherein each color is different than the other two colors. Thus, A", B", and C" all have the same color. The following is an example of assigning colors to storage cells using the example shown in FIG. 2:

| Parity Group | Level 1 | Level 2 | Ignored |
|---|---|---|---|
| 1 | A' | | |
| 2 | B" | | |
| 3 | C'" | A'" B'" A' B' A' B" | CONTROLS |

As shown by the above example, if each of the parity checkers 208, 210, and 212 are individually processed one at a time at level 1 (i.e., level 1 column above), the set A of storage cells 202 checked by parity 1 checker 208 are first assigned a first color as indicated by A'. Next, the set B of storage cells 204 checked by parity 2 checker 210 are assigned a second color as indicated by B". Next, the set C of storage cells 206 checked by parity 3 checker 212 are assigned a third color as indicated by C'".

The assignment of colors to storage cells may also be performed by processing all levels of a given parity checker before processing the next parity checker. As shown by the above example for parity group 3, the set C of storage cells 206 checked by parity 3 checker 212 at level 1 are assigned the third color as indicated by C'". Next, level 2 for parity 3 checker 212 is processed, and the set A of storage cells 202 and the set B of storage cells 204 are assigned colors. In an example, the controls 214 are ignored, and the set A of storage cells 202 is assigned the third color (A'") and the set B of storage cells 204 is also assigned the third color (B'"), so that all three sets A, B, and C are assigned the same color.

It should be noted that, when allowed, increasing the number of colors for storage cells can provide for a more favorable physical design (e.g., lower power, smaller area, less spacing, better performance). This increased coloring allows for more flexibility of placement of devices. To increase the number of colors assigned to parity groups, the controls 214 may be taken into account, as is done in the next example shown above for parity group 3. In this example, after the set C of storage cells 206 checked by parity checker 212 at level 1 are assigned the third color as indicated by C''', level 2 for parity 3 checker 212 is processed, taking into account the controls 214, multiple-cycle pipelines, and orthogonal parity groups. For example, the set A of storage cells 202, the set B of storage cells 204, and the set C of storage cells 206 are considered orthogonal parity groups because data propagated from these sets of storage cells cannot all co-exist at the parity 3 checker 212 at one time. The set A of storage cells 202 and the set B of storage cells 204 may be considered sub-groups from the same level. Structural analysis of a design may be used to determine which bits can co-exist at a checker and identify orthogonal groups. An example of this is multiplexing of different groups into a common parity checker.

Thus, taking this information into account in processing level 2 for parity 3 checker 212, the set A of storage cells 202 and the set B of storage cells 204 are assigned colors that may be the same or different as each other, and different than the color of the set C of storage cells 206. As shown in the above example, the set A of storage cells 202 may be assigned the first color (A') and the set B of storage cells 204 may be assigned the first color (B'), so that sets A and B have the same color, which is different than the color assigned to set C. Alternatively, as shown in the above example, the set A of storage cells 202 may be assigned the first color (A') and the set B of storage cells 204 may be assigned the second color (B'') so that all three sets A, B, and C are assigned different colors.

The following is another example of assigning colors to storage cells using the example shown in FIG. 2:

| Processing Order | Full Cone | Level Only | Orthogonal Sub-Groups |
|---|---|---|---|
| 1, 2, 3 | A' B'' C''' | A' B'' C''' | A' B'' C''' |
| 1, 3, 2 | A' B''' C''' | A' B'' C''' | A' B'' C''' |
| 2, 1, 3 | A' B'' C''' | A' B'' C''' | A' B'' C''' |
| 2, 3, 1 | A' B'' C''' | A' B'' C''' | A' B'' C''' |
| 3, 1, 2 | A''' B'' C''' | A' B' C''' | A' B'' C''' |
| 3, 2, 1 | A''' B''' C''' | A' B' C''' | A' B'' C''' |

As shown above, three different possible outcomes (full cone outcome, level only outcome, and orthogonal sub-groups outcome) are shown for different processing orders of the parity checkers 208, 210, and 212. As shown above, taking into account orthogonal sub-groups during the processing of the parity checkers 208, 210, and 212 results in three different colors being used regardless of processing order.

The following is another example of assigning colors to storage cells using the example shown in FIG. 2:

| Parity Group | Level 1 | Level 2 | Ignored |
|---|---|---|---|
| 1 | A' | | |
| 2 | B'' | | |
| 3 | C''' | A̶ ̶B̶ | CONTROLS |

As shown by the above example, if each of the parity checkers 208, 210, and 210 are individually processed one at a time at level 1 (i.e., level 1 column above), the set A of storage cells 202 checked by parity 1 checker 208 are first assigned a first color as indicated by A'. Next, the set B of storage cells 204 checked by parity 2 checker 210 are assigned a second color as indicated by B''. Next, the set C of storage cells 206 checked by parity 3 checker 212 are assigned a third color as indicated by C'''. After all parity checkers have been processed at level 1, all the parity checkers may then be processed at level 2, followed by level 3, etc. In an example, a constraint is applied such that after a storage cell has been colored by one parity group, the color is not changed for any other parity group. Thus, as shown in the example above, sets A and B are crossed out in the level 2 analysis for parity group 3 because these sets of storage cells have already been assigned colors in the level 1 analysis.

The following is another example of assigning colors to storage cells using the example shown in FIG. 2:

| Parity Group | Level 1 | Level 2 | Ignored |
|---|---|---|---|
| 3 | C''' | A' B' | CONTROLS |
| 1 | A̶ | | |
| 2 | B̶ | | |

As shown by the above example, the assignment of colors to storage cells is performed by processing all levels of a given parity checker before processing the next parity checker. The process may start with larger parity groups having multiple levels, such as parity group 3. As shown by the above example for parity group 3, the set C of storage cells 206 checked by parity 3 checker 212 at level 1 are assigned the third color as indicated by C'''. Next, level 2 for parity 3 checker 212 is processed, and the set A of storage cells 202 and the set B of storage cells 204 are assigned colors. In one example, the controls 214 are ignored, and the set A of storage cells 202 is assigned the first color (A') and the set B of storage cells 204 is also assigned the first color (B'). In an example, a constraint is applied such that after a storage cell has been colored by one parity group, the color is not changed for any other parity group. Thus, as shown in the example above, sets A and B are crossed out in the level 1 analysis because these sets of storage cells have already been assigned colors in the level 2 analysis of parity group 3. In addition, the process may include the removal or powering down of parity checkers for parity groups that are already covered by other parity checkers. In this example, parity 1 checker 208 and parity 2 checker 210 may be removed from the design. In some examples, controls 214 include additional storage devices that can be colored as CONTROLS', CONTROLS'', CONTROLS''', or even CONTROLS'''', a separate color from the other storage devices.

Figure 3:
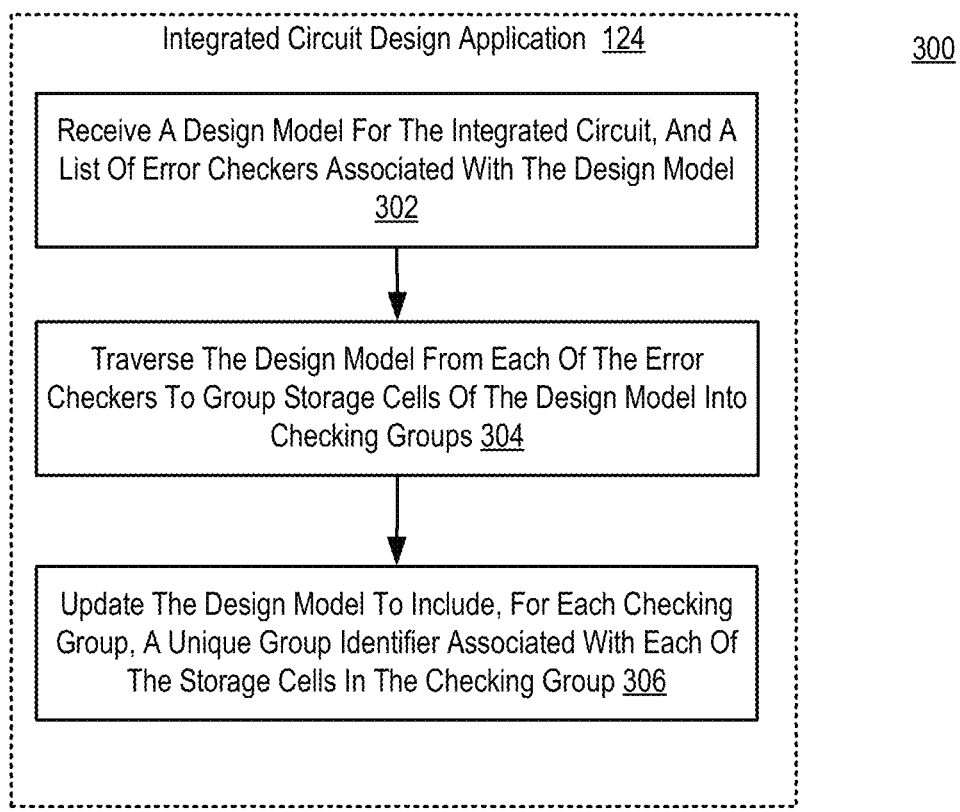
FIG. 3 is a flowchart of an example method for performing error protection analysis of a digital integrated circuit according to some embodiments of the present disclosure.

For further explanation, FIG. 3 is a flowchart of an example method 300 for performing error protection analysis of a digital integrated circuit according to some embodiments of the present disclosure. In a particular embodiment, the method 300 of FIG. 3 is performed utilizing the integrated circuit design application 124. The method 300 of FIG. 3 includes receiving 302 a design model for the integrated circuit, and a list of error checkers associated with the design model. In an example, the design model and the list of error checkers are received by the integrated circuit design application 124. The method 300 further includes traversing 304 the design model from each of the error checkers to group storage cells of the design model into checking groups. The traversing 304 the design model from each of the error checkers to group storage cells of the design model into checking groups may be performed as described above with reference to FIG. 2. The method 300 further includes updating 306 the design model to include, for each checking group, a unique group identifier associated with each of the storage cells in the checking group. The updating 306 may include annotating group labels in RTL as well as a designer side file specification.

In some embodiments of method 300, storage cells of the design model are grouped into checking groups using at least one of a logical structural analyzer and a textual analyzer. In some embodiments, the unique group identifier for each checking group is used to perform spacing when the storage cells of the design model are placed physically. In some embodiments, traversing the design model from each of the error checkers is performed for all error checkers at a given level before analyzing subsequent levels. In some embodiments, traversing the design model from each of the error checkers is performed for multiple levels for a given error checker before analyzing subsequent ones of the error checkers. In some embodiments, traversing the design model from each of the error checkers includes identification of orthogonal checking sub-groups.

In some embodiments, the method 300 further includes identifying redundant error checking based on the traversing; and removing one or more error checkers from the design model based on the identification of redundant error checking. In some embodiments, the error checkers are parity checkers or one-hot checkers.

A method for performing error protection analysis may be performed in a parallel manner to decrease the runtime of the process. For example, N error checkers can be divided into K sets (e.g., K=10 sets, with N/10 error checkers per set). K jobs may then be started to process the K sets of error checkers in parallel. When the K jobs are done, reports from the jobs may be compiled together.

A method for performing error protection analysis may be performed until a specified coverage of storage cells is achieved. For example, after processing a first level for a list of error checkers, the method may check the coverage (e.g., determine whether a threshold number or percentage of all the storage cells have been assigned a color). If the coverage is high enough (e.g., exceeds a given threshold), processing may be stopped. If the coverage is not high enough, the next higher level may be processed, and this may be repeated until the coverage exceeds the given threshold.

Figure 4:
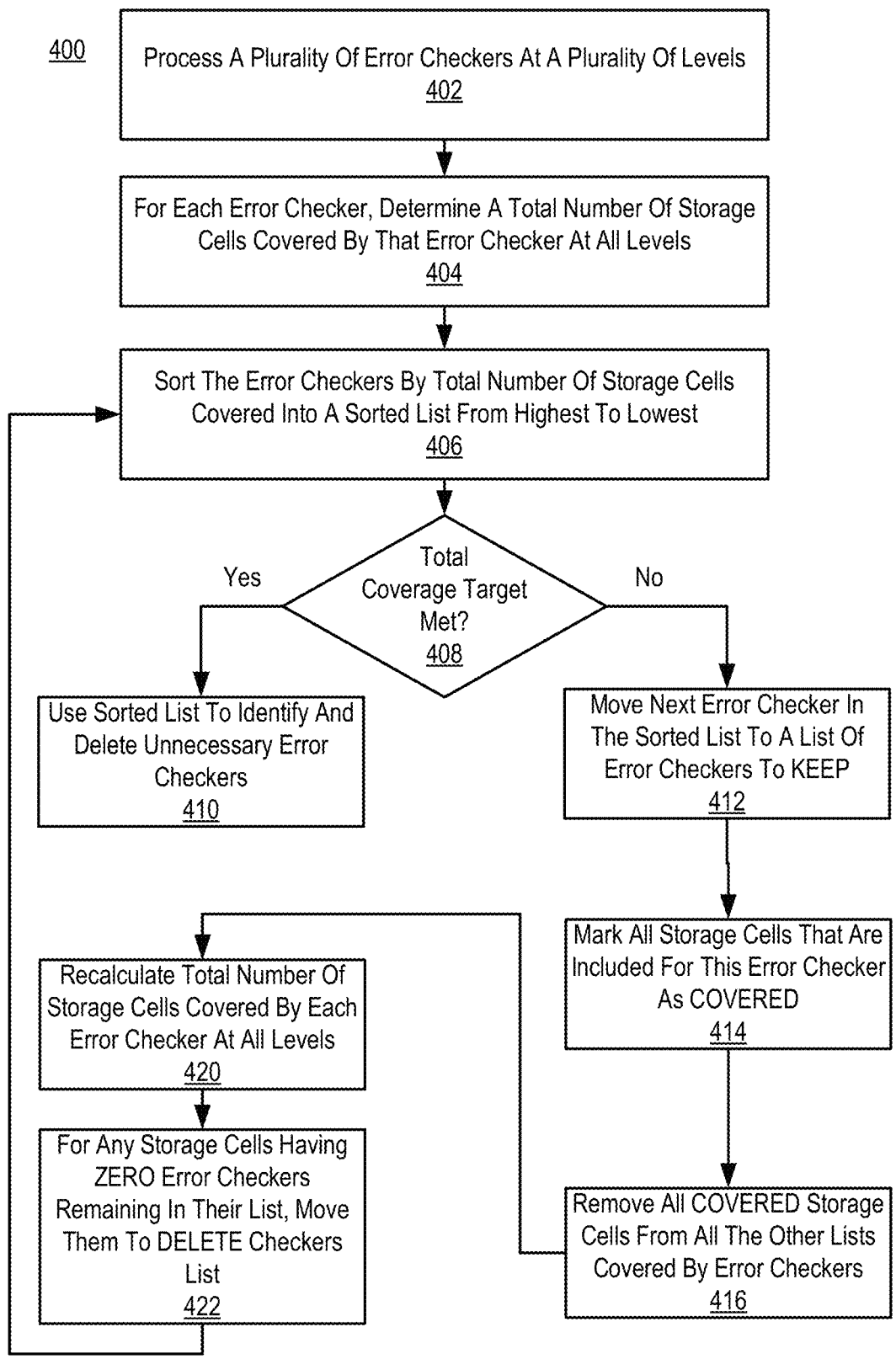
FIG. 4 is a flowchart of an example method for performing error protection analysis of a digital integrated circuit and reducing unnecessary error checkers according to some embodiments of the present disclosure.

For further explanation, FIG. 4 is a flowchart of an example method 400 for performing error protection analysis of a digital integrated circuit and reducing unnecessary error checkers according to some embodiments of the present disclosure. In a particular embodiment, the method 400 of FIG. 4 is performed utilizing the integrated circuit design application 124. The method 400 of FIG. 4 includes processing 402 a plurality of error checkers at a plurality of levels in a design model. The processing at 402 may be performed as described above with reference to FIG. 2 and FIG. 3. The method 400 further includes, for each error checker, determining 404 a total number of storage cells covered by that error checker at all levels. The method 400 further includes sorting 406 the error checkers by total number of storage cells covered into a sorted list from highest to lowest coverage.

The method 400 further includes determining 408 whether a total coverage target has been met. If it is determined at 408 that the total coverage target has been met, the method 400 moves to 410 to use the sorted list to identify and delete unnecessary error checkers. If it is determined at 408 that the total coverage target has not been met, the method 400 moves to 412 to move the next error checker in the sorted list to a list of error checkers to KEEP. The method 400 further includes marking 414 all storage cells that are included for this error checker as COVERED. The method 400 further includes removing 416 all COVERED storage cells from all the other lists covered by other error checkers. The method 400 further includes recalculating 420 the total number of storage cells covered by each error checker at all levels. The method 400 further includes, for any storage cells having ZERO error checkers remaining in their list, moving 422 them to a DELETE checkers list 422. The method 400 then returns to 406 to re-sort the error checkers and continue the method 400.

Exemplary embodiments of the present disclosure are described largely in the context of a fully functional computer system for performing error protection analysis. Readers of skill in the art will recognize, however, that the present disclosure also may be embodied in a computer program product disposed upon computer readable storage media for use with any suitable data processing system. Such computer readable storage media may be any storage medium for machine-readable information, including magnetic media, optical media, or other suitable media. Examples of such media include magnetic disks in hard drives or diskettes, compact disks for optical drives, magnetic tape, and others as will occur to those of skill in the art. Persons skilled in the art will immediately recognize that any computer system having suitable programming means will be capable of executing the steps of the method of the disclosure as embodied in a computer program product. Persons skilled in the art will recognize also that, although some of the exemplary embodiments described in this specification are oriented to software installed and executing on computer hardware, nevertheless, alternative embodiments implemented as firmware or as hardware are well within the scope of the present disclosure.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

It will be understood from the foregoing description that modifications and changes may be made in various embodiments of the present disclosure without departing from its true spirit. The descriptions in this specification are for purposes of illustration only and are not to be construed in a limiting sense. The scope of the present disclosure is limited only by the language of the following claims.

What is claimed is:

1. A method for error protection analysis of an integrated circuit, the method comprising:
   receiving a design model for the integrated circuit and a list of error checkers associated with the design model;
   traversing the design model from each of the error checkers to group storage cells of the design model into checking groups; and
   updating the design model to include, for each checking group, a unique group identifier associated with each of the storage cells in the checking group.

2. The method of claim 1, wherein storage cells of the design model are grouped into checking groups using at least one of a logical structural analyzer and a textual analyzer.

3. The method of claim 1, wherein the unique group identifier for each checking group is used to perform spacing when the storage cells of the design model are placed physically.

4. The method of claim 1, wherein traversing the design model from each of the error checkers is performed for all error checkers at a given level before analyzing subsequent levels.

5. The method of claim 1, wherein traversing the design model from each of the error checkers is performed for multiple levels for a given error checker before analyzing subsequent ones of the error checkers.

6. The method of claim 1, wherein traversing the design model from each of the error checkers includes identification of orthogonal checking sub-groups.

7. The method of claim 1, further comprising:
   identifying redundant error checking based on the traversing; and
   removing one or more error checkers from the design model based on the identification of redundant error checking.

8. The method of claim 1, wherein the error checkers are parity checkers or one-hot checkers.

9. An apparatus for error protection analysis of an integrated circuit, the apparatus comprising:
- a computer processor; and
- a computer memory operatively coupled to the computer processor, the computer memory having disposed therein computer program instructions that, when executed by the computer processor, cause the apparatus to:
  - receive a design model for the integrated circuit and a list of error checkers associated with the design model;
  - traverse the design model from each of the error checkers to group storage cells of the design model into checking groups; and
  - update the design model to include, for each checking group, a unique group identifier associated with each of the storage cells in the checking group.

10. The apparatus of claim 9, wherein storage cells of the design model are grouped into checking groups using at least one of a logical structural analyzer and a textual analyzer.

11. The apparatus of claim 9, wherein the unique group identifier for each checking group is used to perform spacing when the storage cells of the design model are placed physically.

12. The apparatus of claim 9, wherein traversing the design model from each of the error checkers is performed for all error checkers at a given level before analyzing subsequent levels.

13. The apparatus of claim 9, wherein traversing the design model from each of the error checkers is performed for multiple levels for a given error checker before analyzing subsequent ones of the error checkers.

14. The apparatus of claim 9, wherein traversing the design model from each of the error checkers includes identification of orthogonal checking sub-groups.

15. The apparatus of claim 9, wherein the computer program instructions further cause the apparatus to:
- identify redundant error checking based on the traversing; and
- remove one or more error checkers from the design model based on the identification of redundant error checking.

16. A computer program product for error protection analysis of an integrated circuit, the computer program product disposed upon a computer readable medium, the computer program product comprising computer program instructions that, when executed, cause a computer to:
- receive a design model for the integrated circuit and a list of error checkers associated with the design model;
- traverse the design model from each of the error checkers to group storage cells of the design model into checking groups; and
- update the design model to include, for each checking group, a unique group identifier associated with each of the storage cells in the checking group.

17. The computer program product of claim 16, wherein storage cells of the design model are grouped into checking groups using at least one of a logical structural analyzer and a textual analyzer.

18. The computer program product of claim 16, wherein the unique group identifier for each checking group is used to perform spacing when the storage cells of the design model are placed physically.

19. The computer program product of claim 16, wherein traversing the design model from each of the error checkers is performed for all error checkers at a given level before analyzing subsequent levels.

20. The computer program product of claim 16, wherein traversing the design model from each of the error checkers is performed for multiple levels for a given error checker before analyzing subsequent ones of the error checkers.

* * * * *